(12) United States Patent
Taguchi et al.

(10) Patent No.: US 11,627,678 B2
(45) Date of Patent: Apr. 11, 2023

(54) LID STRUCTURE

(71) Applicant: JVCKENWOOD CORPORATION, Yokohama (JP)

(72) Inventors: Hiromi Taguchi, Yokohama (JP); Koichi Yoshizawa, Yokohama (JP); Naoki Mitsui, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 267 days.

(21) Appl. No.: 16/866,356

(22) Filed: May 4, 2020

(65) Prior Publication Data

US 2020/0267862 A1 Aug. 20, 2020

Related U.S. Application Data

(63) Continuation of application No. PCT/JP2018/040804, filed on Nov. 2, 2018.

(30) Foreign Application Priority Data

Nov. 8, 2017 (JP) .............................. JP2017-215236

(51) Int. Cl.
*H05K 5/03* (2006.01)
*B65D 43/16* (2006.01)
(Continued)

(52) U.S. Cl.
CPC .............. *H05K 5/03* (2013.01); *B65D 43/163* (2013.01); *B65D 53/02* (2013.01); *H02G 15/10* (2013.01)

(58) Field of Classification Search
CPC ........ H05K 5/03; B65D 43/163; B65D 53/02; B65D 85/00; H02G 15/10; H02G 3/14;
(Continued)

(56) References Cited

U.S. PATENT DOCUMENTS 6,629,619 B2 * 10/2003 Sato ..................... H02G 3/088
220/378
8,893,910 B2 * 11/2014 Batchelor .............. H02G 3/088
220/242

(Continued)

FOREIGN PATENT DOCUMENTS

EP 2749506 A2 * 7/2014 ............... B65D 1/34
JP H6-44185 U 6/1994
(Continued)

*Primary Examiner* — Jennifer Robertson
*Assistant Examiner* — John Martin Hoppmann
(74) *Attorney, Agent, or Firm* — Procopio, Cory, Hargreaves & Savitch LLP

(57) ABSTRACT

A lid structure capable of preventing a lid member from being opened due to a jet stream by using a simple structure is provided. A lid structure includes a lid member configured to cover a housing part of a housing container, and a protrusion disposed near an end of an opposing surface of the lid member, the opposing surface being located on a side of the lid member that is opposed to the housing part when the lid member covers the housing part. The protrusion is disposed in a position that is located outside the housing part when the lid member covers the housing part. The protrusion includes an inclined surface inclined from a direction perpendicular to the opposing surface toward the end of the opposing surface.

5 Claims, 8 Drawing Sheets

(51) Int. Cl.
*H02G 15/10* (2006.01)
*B65D 53/02* (2006.01)

(58) Field of Classification Search
CPC ...... H02G 3/088; H02G 3/081; H02G 15/013; H01R 13/5202; H01H 9/04; Y02E 10/50
USPC ......... 220/241, 735, 736; 439/676; 312/296, 312/223.1; 174/66, 67, 382; 361/679.01
See application file for complete search history.

(56) References Cited

U.S. PATENT DOCUMENTS

| | | | | |
|---|---|---|---|---|
| 2005/0109529 | A1* | 5/2005 | Nagashima | H02G 3/14 |
| | | | | 174/67 |
| 2011/0240363 | A1* | 10/2011 | Dinh | H02G 3/088 |
| | | | | 174/551 |
| 2014/0110144 | A1* | 4/2014 | Shotey | H05K 5/03 |
| | | | | 174/67 |
| 2015/0230356 | A1* | 8/2015 | Shinoda | H01R 13/5213 |
| | | | | 455/575.8 |

FOREIGN PATENT DOCUMENTS

| | | | | |
|---|---|---|---|---|
| JP | 2004-197882 A | | 7/2004 | |
| JP | 2006-158172 A | | 6/2006 | |
| JP | 2010041740 A | | 2/2010 | |
| WO | WO-2010147036 A1 * | 12/2010 | ......... B60R 16/0238 |

\* cited by examiner

LID STRUCTURE

CROSS REFERENCE TO RELATED APPLICATION

This application is a Bypass Continuation of PCT/JP2018/040804, filed on Nov. 2, 2018, which is based upon and claims the benefit of a priority from Japanese patent application No. 2017-215236, filed on Nov. 8, 2017, the disclosure of which is incorporated herein in its entirety by reference.

BACKGROUND

The present invention relates to a lid structure.

A housing container for housing an object that needs to be kept in a watertight state needs to have a waterproof structure. In such a housing container, for example, a structure in which a lid is press-fitted with a housing with a gasket interposed therebetween is widely used because of a low cost, ease of handling, and simplicity of the structure.

In connection with such a technique, Japanese Unexamined Patent Application Publication No. 2004-197882 discloses a tight-fitting structure between members in which first and second members are tightly fitted with each other through a gasket disposed in a recessed part formed along the circumferential direction of at least one of the first and second members. Further, Japanese Unexamined Patent Application Publication No. 2006-158172 discloses a closure for housing a connection part of an optical cable or an electric cable in such a manner that closure can be opened and closed. The closure disclosed in Japanese Unexamined Patent Application Publication No. 2006-158172 has a structure in which end-face members are provided at both ends of a cylindrical body in which the connection part is housed. The cable is introduced into the closure through the end-face member. An end-face gasket made of a rubber-like elastic material is provided in a cable passing-though part of the end-face member so that no water enters the closure.

SUMMARY

Regarding products that need to be waterproof as their specifications, for example, for products in a protection class such as an IPX5 class, it is necessary to prevent a jet stream from adversely affecting an object to be protected housed in a housing container. Meanwhile, in the above-described technique, there is a possibility that the lid is opened when the housing container housing the object to be protected receives a jet stream. Further, it is also conceivable to provide a robust lock mechanism or the like so that the lid is prevented from being opened due to a jet stream. However, the use of such a mechanism may complicate the structure of the housing container. Therefore, it is desired to improve the waterproofness against a jet stream by using a simple structure.

In view of the above-described problem, an object of this embodiment is to provide a lid structure capable of preventing a lid member from being opened due to a jet stream by using a simple structure.

Accordingly, this embodiment provides a lid structure including: a lid member configured to cover a housing part of a housing container; and a protrusion disposed near an end of a first surface of the lid member, the first surface being located on a side of the lid member that is opposed to the housing part when the lid member covers the housing part, in which the protrusion is disposed in a position that is located outside the housing part when the lid member covers the housing part, and the protrusion includes a second surface inclined from a direction perpendicular to the first surface toward the end of the first surface.

DETAILED DESCRIPTION

First Embodiment

Figure 1:
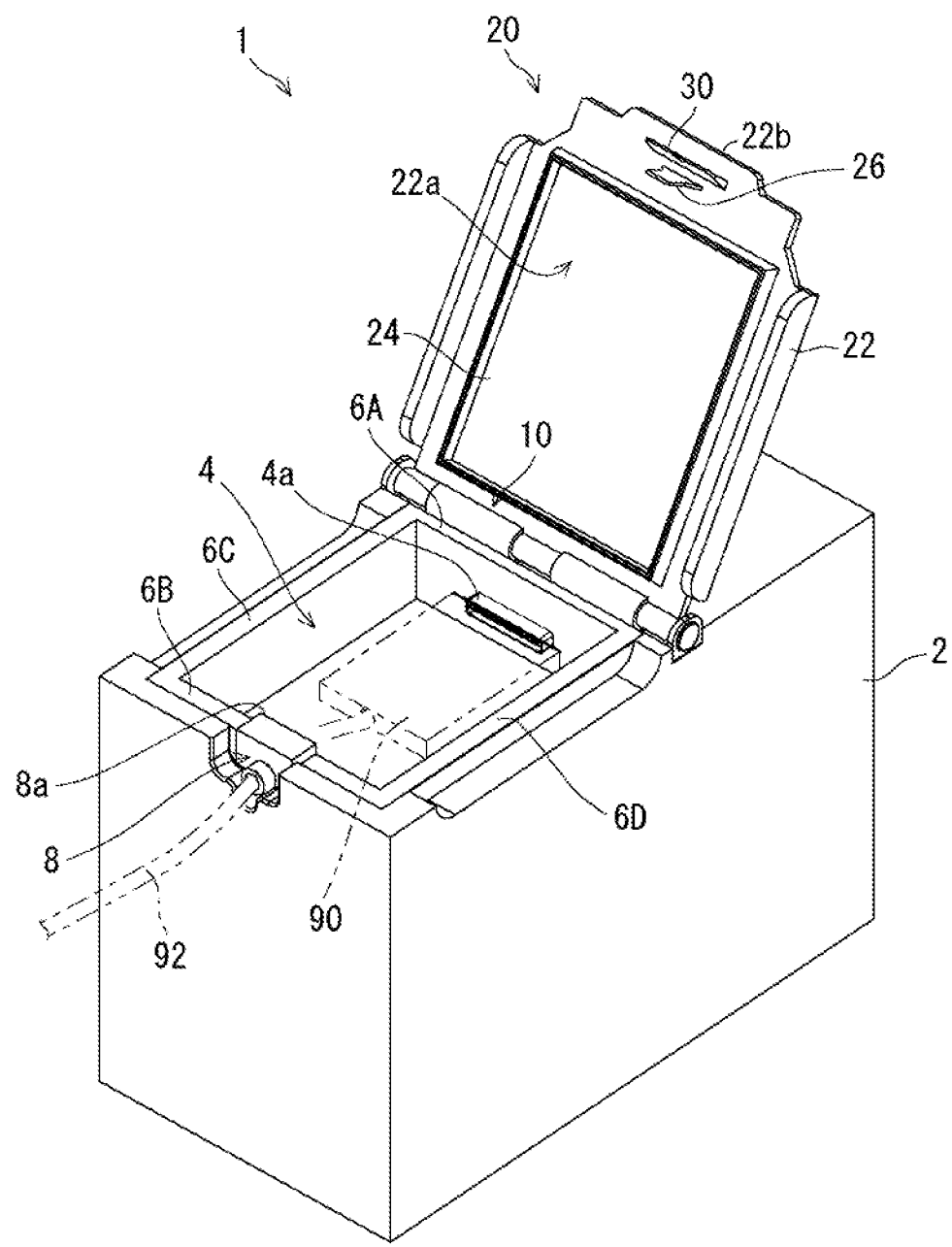
FIG. 1 is a perspective view showing a housing container according to a first embodiment.

Embodiments according to the present invention will be described hereinafter with reference to the drawings. Note that substantially the same components are denoted by the same reference numerals.

Figure 2:
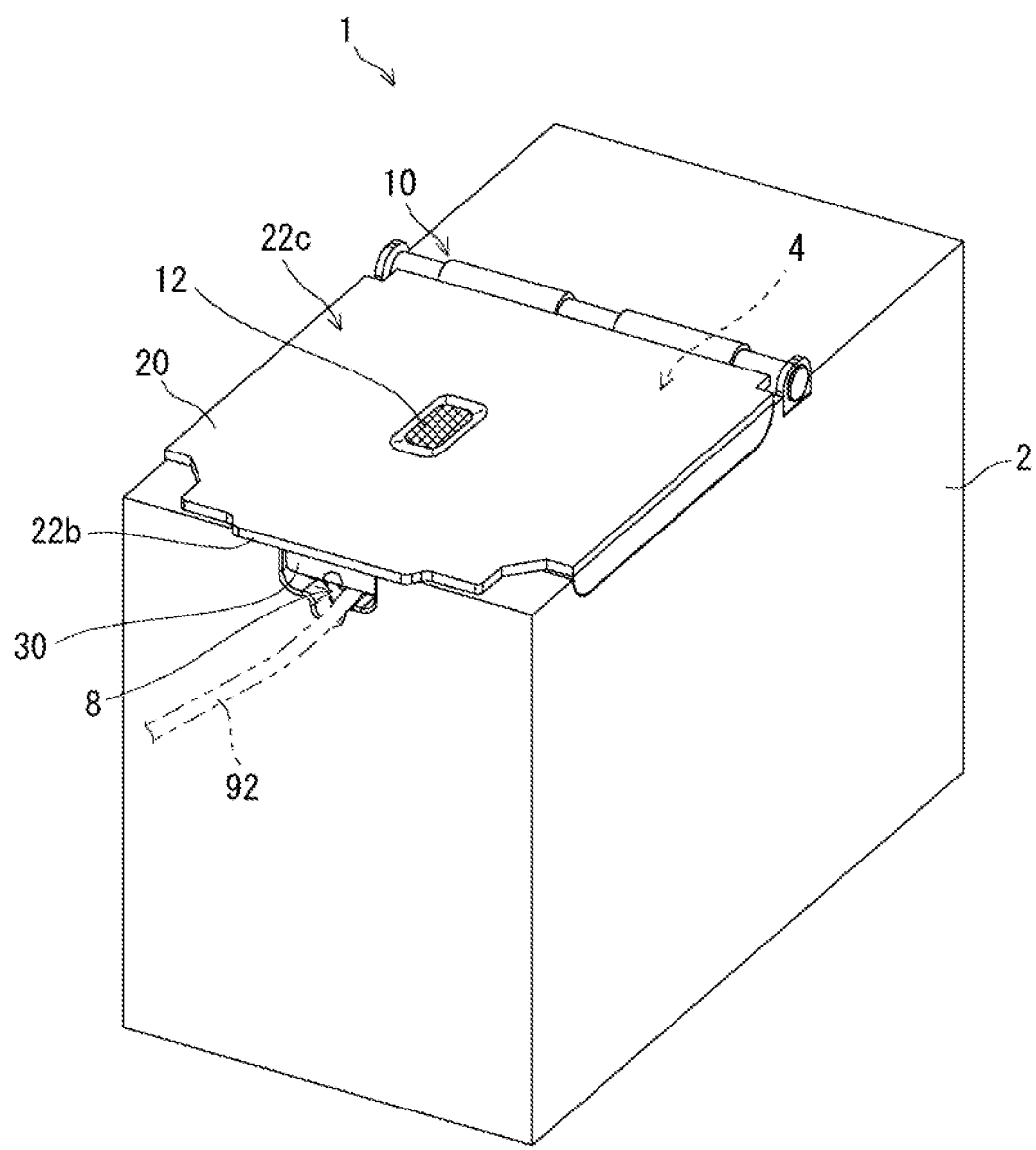
FIG. 2 is a perspective view showing the housing container according to the first embodiment.

FIGS. 1 and 2 are perspective views showing a housing container 1 according to a first embodiment. FIG. 1 shows a state in which a lid member is opened. Meanwhile, FIG. 2 shows a state in which the lid member is closed. The housing container 1 houses a connection part 90 of a cable 92 such as a communication cable, an optical cable, or an electric cable. The connection part 90 is, for example, a connector.

The housing container 1 includes a housing 2, a housing part 4 disposed in the housing 2, a lid structure 20, and a hinge part 10 that connects the housing 2 with the lid structure 20. The housing part 4 is formed in such a manner that its four sides are surrounded by side walls 6A, 6B, 6C and 6D. The lid structure 20 includes a lid member 22, i.e., a lid main body and a protrusion 30. The protrusion 30 will be described later with reference to FIG. 3 and the like.

The lid member 22 is rotatably connected to the housing 2 with the hinge part 10 interposed therebetween. The lid member 22 can rotate around the hinge part 10 from an opened state shown in FIG. 1 to a closed state shown in FIG. 2. The lid member 22 can also rotate around the hinge part 10 in a reverse direction, i.e., from the closed state shown in FIG. 2 to the opened state shown in FIG. 1. In the state shown in FIG. 2, the lid member 22 covers the housing part 4. In other words, in the state shown in FIG. 2, the lid member 22 is in a closed state for the housing part 4. Meanwhile, in the state shown in FIG. 1, the lid member 22 is in an opened state for the housing part 4.

The side wall 6A is disposed on the side of the housing part 4 on which the hinge part 10 is disposed. The side wall 6B is disposed in a position where it is opposed to the side wall 6A. The side wall 6C is disposed on the left side as viewed from the side wall 6B toward the side wall 6A. The side wall 6D is disposed on the right side as viewed from the side wall 6B toward the side wall 6A. A terminal member 4a is provided on the side wall 6A. The terminal member 4a is configured so that it can be engaged with a terminal member of the connection part 90 in a state where the connection part 90 is housed in the housing part 4.

A cut-out part 8 for enabling the cable 92 to pass therethrough is provided in the side wall 6B. A bushing 8a formed of an elastic member such as rubber is inserted into the cut-out part 8. The bushing 8a is configured so that the cable 92 is inserted therethrough. Therefore, the bushing 8a is configured so that it can cover the outer periphery of the cable 92 in the cut-out part 8. The bushing 8a prevents water from entering the housing part 4 from the cutout part 8 along the cable 92. Note that the cable 92 and the bushing 8a may be integrally formed.

A gasket 24 formed of an elastic member such as rubber is attached to an opposing surface 22a (a first surface) of the lid member 22 located on the side that is opposed to the housing part 4 when the lid member 22 covers the housing part 4. The gasket 24 is formed in a rectangular shape so that its shape conforms to the shape of the outer periphery of the housing part 4, i.e., conforms to the shapes of the side walls 6A, 6B, 6C and 6D. As shown in FIG. 2, when the lid member 22 covers the housing part 4, the gasket 24 comes into contact with the upper end surfaces of the side walls 6A, 6B, 6C and 6D. Further, when a user brings a lock mechanism 12 provided on the surface 22c of the lid member 22 into a locked state, the lid member 22 is fixed to the housing 2. In this way, the gasket 24 is brought into tight contact with the upper end surfaces of the side walls 6A, 6B, 6C and 6D.

Therefore, when the lid member 22 covers the housing part 4 as shown in FIG. 2, the housing part 4 is hermetically sealed by the gasket 24 and the bushing 8a. It is necessary to keep the terminal member of the connection part 90 and the terminal member 4a in a watertight state. As the housing part 4 is hermetically sealed as described above, the waterproofness of the connection part 90 is kept in the state where the connection part 90 is connected to the terminal member 4a. That is, it is possible to prevent moisture from entering the housing part 4 in the state where the connection part 90 is connected to the terminal member 4a. Therefore, even when the terminal member of the connection part 90 and the terminal member 4a are not waterproof in themselves, the waterproofness of the terminal member of the connection part 90 and the terminal member 4a is maintained by closing the lid member 22.

Further, as shown in FIG. 1, a jet-stream suppression part 26 is provided near the end 22b, of the opposing surface 22a of the lid member 22, located on the side opposite to the hinge part 10. The jet-stream suppression part 26 abuts against the cable 92 in the state where the cover member 22 covers the housing part 4 as shown in FIG. 2. In this way, in the case where a jet stream hits on the cut-out part 8, it is possible to prevent the jet stream from directly hitting on the gap between the gasket 24 and the bushing 8a disposed in the side wall 6B. Therefore, it is possible to prevent a jet of water from entering from the gap between the gasket 24 and the bushing 8a in the cut-out part 8. Further, as shown in FIG. 2, when the lid member 22 covers the housing part 4, the protrusion 30 is positioned outside the housing part 4. In other words, the protrusion 30 is disposed in a position that is located outside the housing part 4 when the lid member 22 covers the housing part 4.

Figure 3:
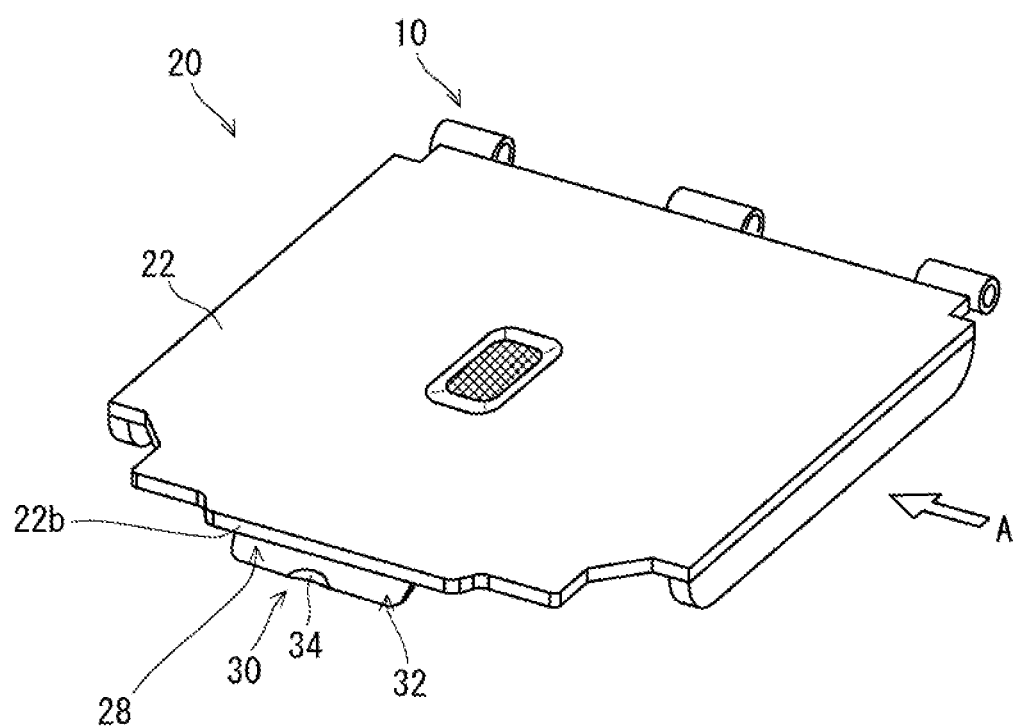
FIG. 3 is a perspective view showing a lid structure according to the first embodiment.
Figure 4:
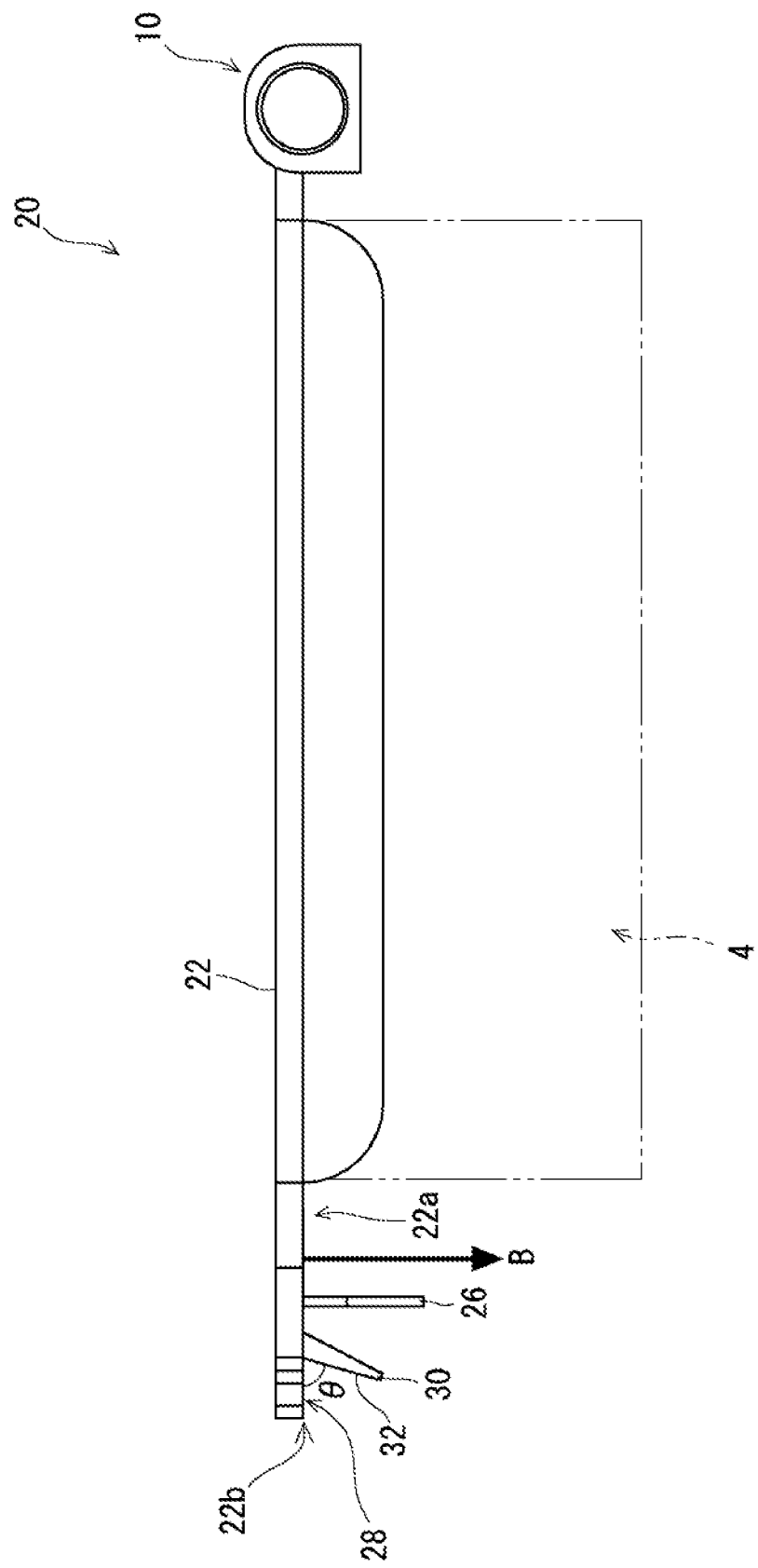
FIG. 4 is a side view showing the lid structure according to the first embodiment.

FIG. 3 is a perspective view showing the lid structure 20 according to the first embodiment. Further, FIG. 4 is a side view showing the lid structure 20 according to the first embodiment. FIG. 4 shows the lid structure 20 as viewed in a direction indicated by an arrow A in FIG. 3. The protrusion 30 is disposed near the end 22b of the opposing surface 22a. The protrusion 30 is disposed between the end 22b and the jet-stream suppression part 26. Therefore, the protrusion 30 is disposed in a position that is located outside the housing part 4 when the lid member 22 covers the housing part 4.

Further, a finger hooking part 28 is provided between the end 22b and the protrusion 30. The finger hooking part 28 is configured so that a finger is hooked thereon when a user brings the lid member 22 into an opened state for the housing part 4 (a state shown in FIG. 1). The user can easily open the lid member 22 by hooking his/her finger on the finger hooking part 28.

The protrusion 30 includes an inclined surface 32 (a second surface). The inclined surface 32 is disposed on the side of the protrusion 30 on which the end 22b is located. As shown in FIG. 4, the inclined surface 32 is formed so as to be inclined from a direction perpendicular to the opposing surface 22a indicated by an arrow B toward the end 22b. In other words, the angle $\theta$ of the inclined surface 32 with respect to the side of the opposing surface 22a on which the end 22b is located is smaller than 90 degrees. That is, the angle $\theta$ is expressed as "$0°<\theta<90°$".

Further, a curved surface part 34 is formed in the tip of the protrusion 30. When the cable 92 comes into contact with the tip of the protrusion 30 in the state where the connection part 90 is housed in the housing part 4, the cable 92 comes into contact with the curved surface part 34. In this way, even when the cable 92 comes into contact with the tip of the protrusion 30, the bending of the cable 92 at the tip of the protrusion 30 is made gentler. That is, the curvature of the cable 92 can be reduced.

Figure 5:
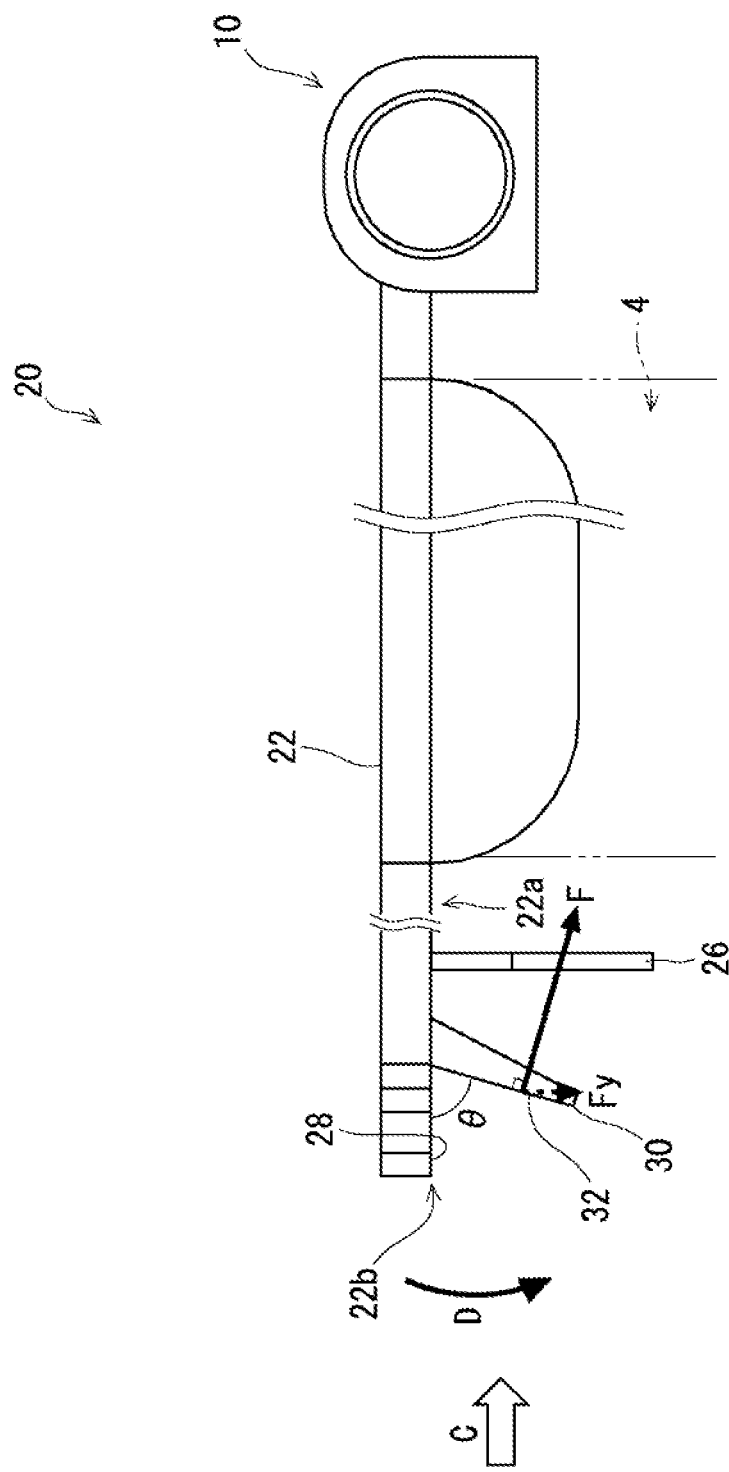
FIG. 5 is a diagram showing a behavior of the lid structure according to the first embodiment when it receives a jet stream coming in a direction from an end opposite to a hinge part in a state where a housing part is covered with a lid member.

FIG. 5 is a diagram showing a behavior of the lid structure 20 according to the first embodiment when it receives a jet stream coming in a direction from the end 22b opposite to the hinge part 10 in the state where the housing part 4 is covered with the lid member 22. When the lid structure 20 receives a jet stream coming in a direction from the end 22b as indicated by an arrow C, a force F is applied, by the jet stream, to the inclined surface 32 of the protrusion 30 in a direction perpendicular to the inclined surface 32. The force F has a component Fy in a direction in which the lid member 22 is directed toward the housing part 4, i.e., in the downward direction in FIG. 5. Therefore, the lid member 22 is pressed toward the housing part 4 as indicted by an arrow D. That is, the lid member 22 is pressed in the closing direction of the lid member 22.

As described above, even when the lid structure 20 receives a jet stream coming in a direction from the end 22b, a force F that presses the lid member 22 in the closing direction can be generated because the protrusion 30 is provided in the lid member 22. Therefore, even when the lid structure 20 receives a jet stream coming in a direction from the end 22b, the lid member 22 is prevented from being opened.

Further, the prevention of the opening of the lid member 22 can be realized by a simple structure in which the protrusion 30 is provided near the end 22b. Therefore, the lid structure 20 according to the first embodiment can prevent the lid member 22 from being opened due to a jet stream by using the simple structure.

Note that the component Fy is expressed as "Fy=f·sin θ·cos θ", where f is a force caused by a jet stream in a direction indicted by the arrow C. Note that the term "sin θ·cos θ" is maximized when the angle θ is 45° (θ=45°). Therefore, by setting the angle θ to a value closer to 45° (e.g., 40°<θ<50°), the lid member 22 can be prevented from being opened due to a jet stream more effectively.

Comparative Example

Next, a comparative example will be described.

Figure 6:
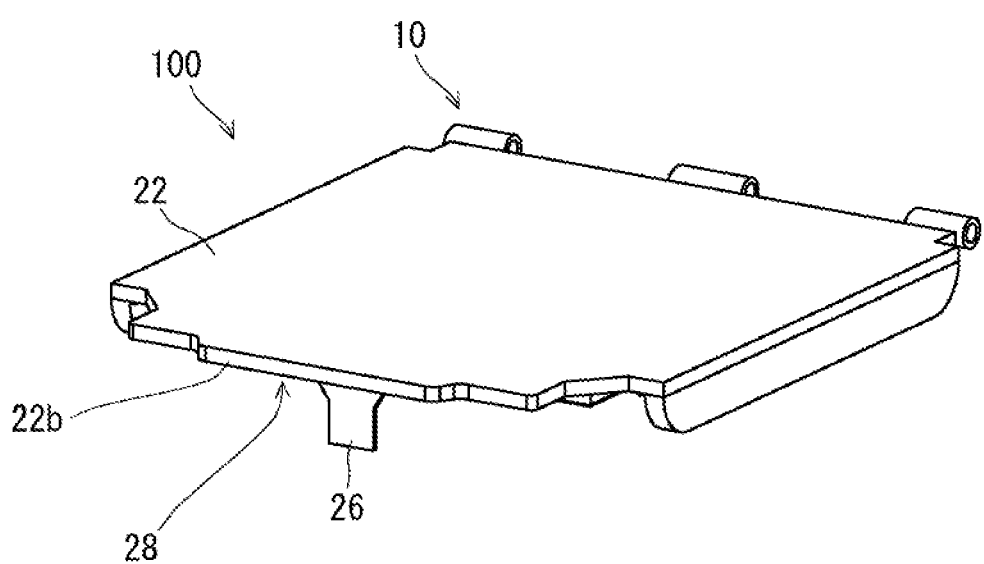
FIG. 6 is a perspective view showing a lid structure according to a comparative example.
Figure 7:
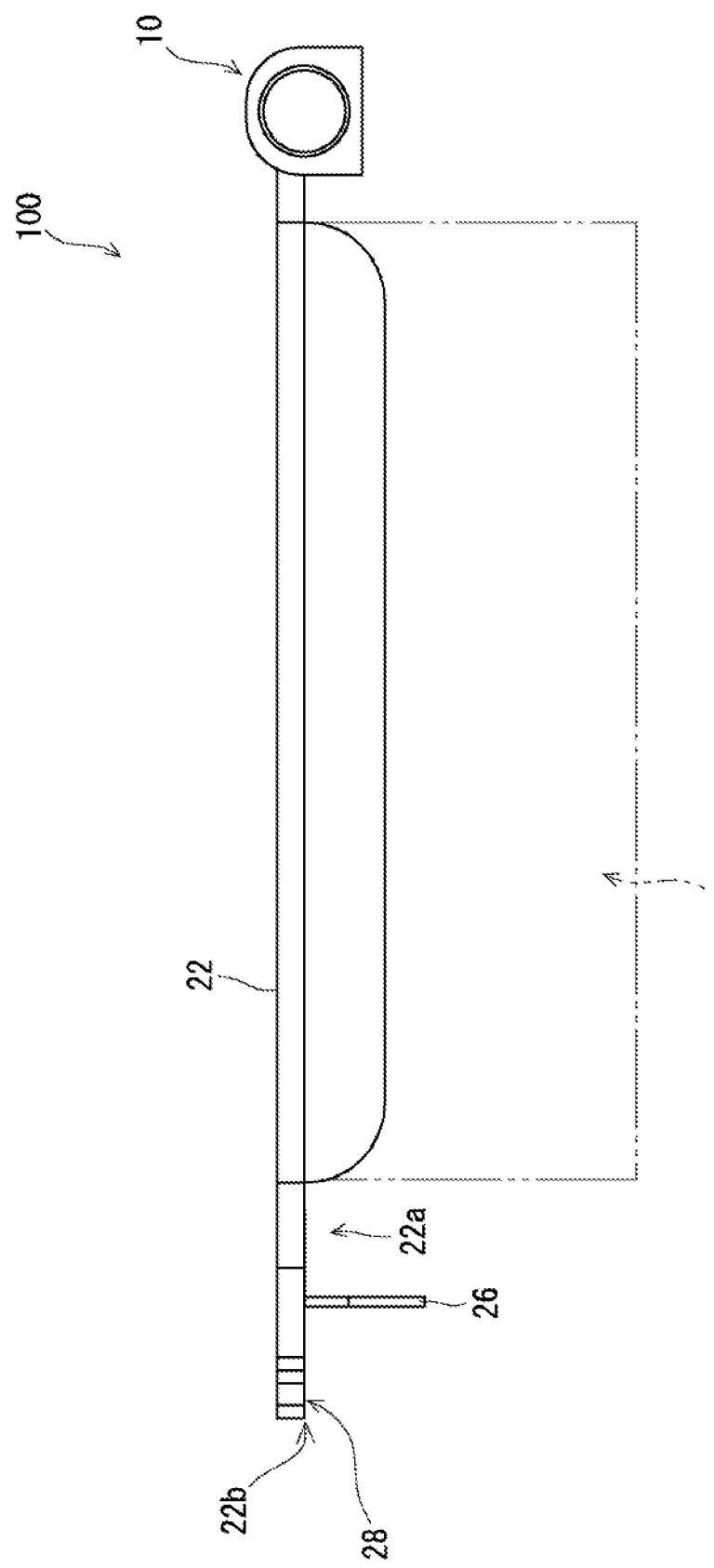
FIG. 7 is a side view showing the lid structure according to the comparative example.

FIG. 6 is a perspective view showing a lid structure 100 according to a comparative example. Further, FIG. 7 is a side view showing the lid structure 100 according to the comparative example. FIGS. 6 and 7 correspond to FIGS. 3 and 4, respectively. The lid structure 100 according to the comparative example differs from the lid structure 20 according to the first embodiment because the lid structure 100 does not include the projections 30. The rest of the configuration of the lid structure 100 according to the comparative example is substantially the same as that of the lid structure 20 according to the first embodiment.

Figure 8:
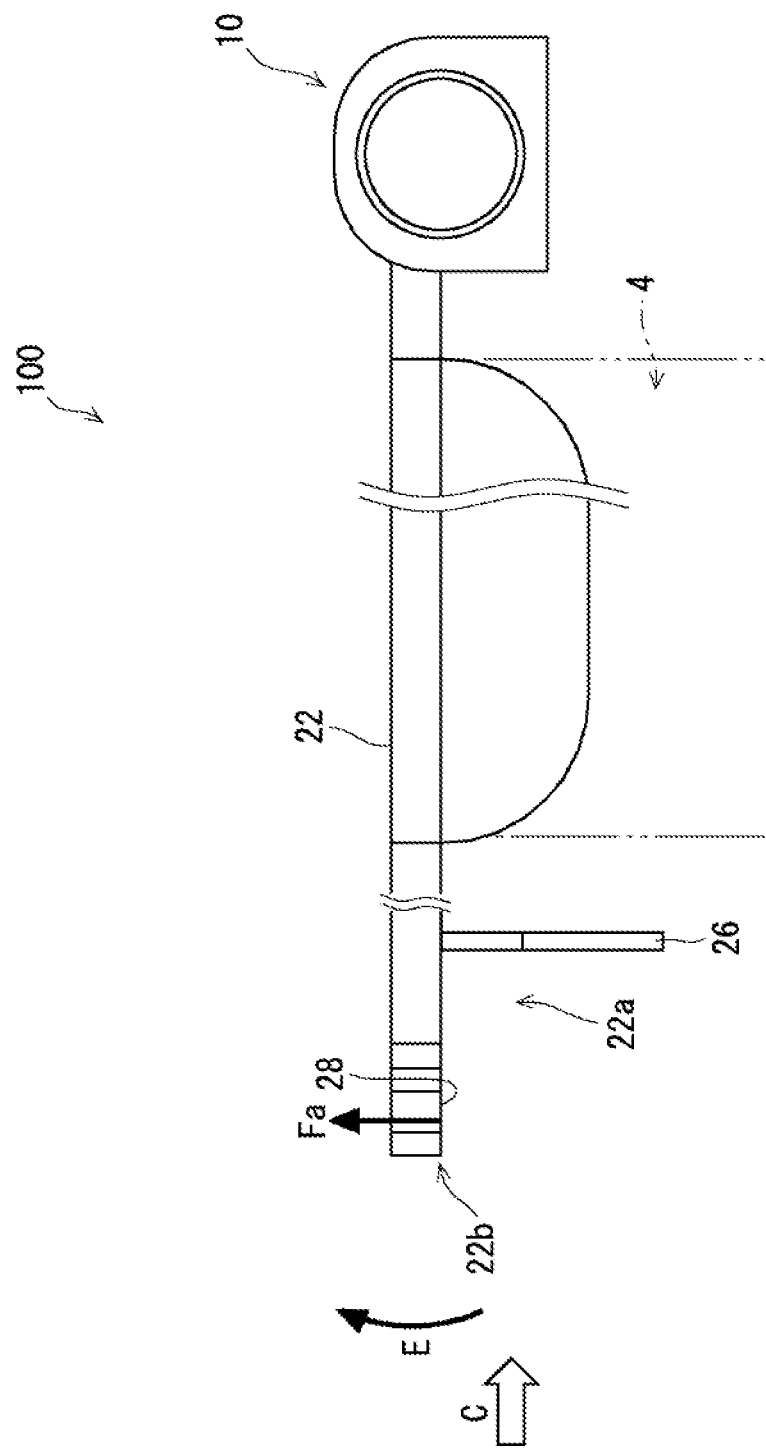
FIG. 8 is a diagram showing a behavior of the lid structure according to the comparative example when it receives a jet stream coming in a direction from an end opposite to a hinge part in a state where a housing part is covered with a lid member.

FIG. 8 is a diagram showing a behavior of the lid structure 100 according to the comparative example when it receives a jet stream coming in a direction from the end 22b opposite to the hinge part 10 in a state where the housing part 4 is covered with the lid member 22. When the lid structure 100 receives a jet stream coming in a direction from the end 22b as indicated by an arrow C, a force Fa may be applied, by the jet stream, to the finger hooking part 28 in a direction away from the housing 4, i.e., in the upward direction in FIG. 8. As a result, as indicated by an arrow E, there is a possibility that the lid member 22 is pressed in the opening direction of the housing part 4.

Therefore, in the lid structure 100 according to the comparative example, there is a possibility that when the lid structure 100 receives a jet stream coming in a direction from the end 22b, the lid member 22 is pressed in the opening direction. Therefore, in the lid structure 100 according to the comparative example, there is a possibility that the lid member 22 is opened by the jet stream. Therefore, in the lid structure 100 according to the comparative example, there is a possibility that the waterproofness against a jet stream cannot be ensured.

In contrast to this, in the lid structure 20 according to the first embodiment, it is possible to generate a force in the closing direction of the lid member 22 by a force applied by a jet stream as described above. Therefore, the lid structure 20 according to the first embodiment can prevent the lid member 22 from being opened even when it receives a jet stream. Therefore, the lid structure 20 according to the first embodiment can ensure the waterproofness against a jet stream.

Note that the finger hooking part 28 is provided in the lid structure 20 according to the first embodiment. Therefore, even in the case of the lid structure 20 according to the first embodiment, there is a possibility that a force Fa is applied, by a jet stream, to the finger hooking part 28 in the direction away from the housing part 4. However, the force Fa is much smaller than the component Fy of the force F. Therefore, the force Fa applied to the finger hooking part 28 is cancelled out by the force F applied to the inclined surface 32. Therefore, in the lid structure 20 according to the first embodiment, even in the case where the finger hooking part 28 is provided, the lid member 22 is prevented from being opened when it receives a jet stream.

Modified Example

Note that the present invention is not limited to the above-described embodiment and may be modified as desired without departing from the spirit and scope thereof. For example, in the above-described embodiment, the housing container 1 houses the connection part of the cable. However, the present invention is not limited to such a configuration. The housing container 1 according to the first embodiment can be applied to a container capable of housing an arbitrary object to be protected that needs to be protected from a jet of water.

Further, in the above-described embodiment, the protrusion 30 is disposed near the finger hooking part 28. However, the present invention is not limited to such a configuration. The protrusion 30 does not have to be disposed near the finger hooking part 28. Further, the finger hooking part 28 is not indispensable. However, by providing the protrusion 30 near the finger hooking part 28, a force applied, by a jet stream, to the finger hooking part 28 in the opening direction of the lid member 22 can be cancelled out.

Further, the lid structure 20 according to the above-described first embodiment is connected to the housing 2 with the hinge part 10 interposed therebetween. However, the present invention is not limited to such a configuration. The hinge part 10 is not indispensable. Further, the lid structure 20 may be detachable from the housing 2. Further, in the above-described first embodiment, the protrusion 30 is disposed near the end 22b of the opposing surface 22a of the lid member 22 on the side opposite to the hinge part 10. However, the present invention is not limited to such a configuration. For example, the protrusion 30 may be provided in a place on the opposing surface 22a of the lid member 22 that is opposed to the side wall 6C or 6D. However, when the lid member 22 receives a jet stream from the side of the end 22b opposite to the hinge part 10, i.e., from the side on which the side wall 6B is disposed, the lid member 22 is opened more easily than when the lid member 22 receives a jet stream from the side on which the side wall 6C or 6D is disposed. Therefore, it is possible to prevent the lid member 22 from being opened more effectively by providing the protrusion 30 near the end 22b of the opposing surface 22a of the lid member 22 on the side opposite to the hinge part 10.

Although the present invention has been explained with reference to embodiments, the present invention is not limited to those embodiments. Various modifications can be made to the configurations and the details of the present invention by those skilled in the art without departing from the spirit and scope of the present invention.

According to this embodiment, it is possible to provide a lid structure capable of preventing a lid member from being opened due to a jet stream by using a simple structure.

The present invention is applicable, for example, to lid structures of housing containers.

What is claimed is:

1. A lid structure comprising:
   a lid member configured to cover a housing part of a housing container;
   a protrusion disposed near an end of a first surface of the lid member, the first surface being located on a side of the lid member that is opposed to the housing part when the lid member covers the housing part; and a jet-stream suppression part provided near the end of the first surface, the protrusion is disposed between the end of the first surface and the jet-stream suppression part, wherein the protrusion is disposed in a position that is located outside the housing part when the lid member covers the housing part, wherein the protrusion includes a second surface facing the end of the first surface, the protrusion being inclined with respect to a direction perpendicular to the first surface in an inclined angle, the protrusion extending toward the end of the first surface in the inclined angle, wherein the second surface is formed from a joint with the first surface to the end of the protrusion, and wherein the lid structure is configured to seal an entirety of the housing container for a cable that enters the housing container in a same direction that the jet-stream suppression part suppresses a jet-stream through the second surface of the protrusion.

2. The lid structure according to claim 1, wherein the lid structure is rotatably connected to the housing of the housing container with a hinge part interposed therebetween, and the protrusion is disposed near an end of the first surface opposite to the hinge part.

3. The lid structure according to claim 1, wherein a finger hooking part is provided in the end of the first surface, the finger hooking part being formed toward inside of the lid member and being configured so that a finger is hooked thereon when a user brings the lid member into an opened state for the housing part, and the protrusion is disposed near the finger hooking part.

4. The lid structure according to claim 1, further comprising:

a hinge part that rotatably connects the lid structure with the housing, wherein the protrusion is disposed near the end of the first surface on a side opposite to the hinge part and in a position that is located outside the housing part, and wherein the second surface is inclined with respect to the direction perpendicular to the first surface and extends toward the end on the side opposite to the hinge part.

5. The lid structure according to claim 1, wherein the joint is configured by connecting the first surface and the second surface so that an angle θ of the second surface with respect to a side of the end of the first surface is smaller than 90 degrees.

* * * * *